(12) United States Patent
Vaidyanathan

(10) Patent No.: US 11,017,135 B2
(45) Date of Patent: May 25, 2021

(54) SCAN LOGIC FOR CIRCUIT DESIGNS WITH LATCHES AND FLIP-FLOPS

(71) Applicant: Microchip Technology Incorporated, Chandler, AZ (US)

(72) Inventor: Athmanathan Vaidyanathan, Gilbert, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 192 days.

(21) Appl. No.: 15/667,363

(22) Filed: Aug. 2, 2017

(65) Prior Publication Data

US 2017/0329884 A1 Nov. 16, 2017

Related U.S. Application Data

(63) Continuation-in-part of application No. 15/359,692, filed on Nov. 23, 2016, now abandoned.

(60) Provisional application No. 62/259,408, filed on Nov. 24, 2015.

(51) Int. Cl.
```
G01R 31/28      (2006.01)
G06F 30/30      (2020.01)
G01R 31/3177    (2006.01)
G01R 31/317     (2006.01)
G01R 31/3185    (2006.01)
```
(52) U.S. Cl.
CPC ......... *G06F 30/30* (2020.01); *G01R 31/3177* (2013.01); *G01R 31/31704* (2013.01); *G01R 31/31723* (2013.01); *G01R 31/31727* (2013.01); *G01R 31/318544* (2013.01); *G01R 31/318558* (2013.01)

(58) Field of Classification Search
CPC . G06F 17/5045; G06F 30/30; G01R 3/31704; G01R 3/31723; G01R 3/31727; G01R 3/3177; G01R 3/318544; G01R 3/318558
See application file for complete search history.

(56) References Cited

U.S. PATENT DOCUMENTS

| | | | |
|---|---|---|---|
| 5,043,986 A * | 8/1991 | Agrawal | G01R 31/318583 714/731 |
| 5,257,267 A * | 10/1993 | Ishizaka | G01R 31/318541 714/731 |
| 5,909,453 A | 6/1999 | Kelem et al. | 714/727 |
| 5,983,377 A * | 11/1999 | Knotts | G01R 31/318572 714/724 |

(Continued)

OTHER PUBLICATIONS

Computer Dictionary, 2nd Edition, Published by Microsoft Press, p. 233. (Year: 1994).*

(Continued)

*Primary Examiner* — Christine T. Tu
(74) *Attorney, Agent, or Firm* — Slayden Grubert Beard PLLC

(57) ABSTRACT

Embodiments of the present disclosure may include a system for scanning a circuit, the embodiments including flip-flops, latches interleaved between the flip-flops, multiplexers configured to propagate scan data between the flip-flops and latches, and scan logic configured to control the multiplexers to load test data into the flip-flops and latches. A first pair of latches are interleaved between a first pair of flip-flops.

4 Claims, 15 Drawing Sheets

(56) References Cited

U.S. PATENT DOCUMENTS

| | | | |
|---|---|---|---|
| 6,191,629 B1* | 2/2001 | Bisanti | H03K 3/2885 |
| | | | 327/202 |
| 6,622,273 B1 | 9/2003 | Barnes | 714/733 |
| 7,246,287 B1 | 7/2007 | Chua-eoan et al. | 714/733 |
| 8,261,143 B2 | 9/2012 | Swoboda et al. | 714/726 |
| 2005/0108604 A1 | 5/2005 | Wong | 714/726 |
| 2011/0239069 A1* | 9/2011 | Ramaraju | G06F 11/267 |
| | | | 714/731 |
| 2013/0179742 A1 | 7/2013 | Tekumalla | 714/726 |
| 2016/0266202 A1 | 9/2016 | Mittal et al. | 714/727 |

OTHER PUBLICATIONS

International Search Report and Written Opinion, Application No. PCT/US2016/063471, 10 pages, dated Feb. 10, 2017.
U.S. Final Office Action, U.S. Appl. No. 15/359,692, 14 pages, dated Aug. 7, 2018.
U.S. Non-Final Office Action, U.S. Appl. No. 15/359,692, 13 pages, dated Jan. 8, 2018.

* cited by examiner

SCAN LOGIC FOR CIRCUIT DESIGNS WITH LATCHES AND FLIP-FLOPS

RELATED PATENT APPLICATION

This application is a continuation-in-part to commonly owned U.S. patent application Ser. No. 15/359,692 filed Nov. 21, 2016, which in turns claims priority to U.S. Provisional Patent Application No. 62/259,408 filed Nov. 24, 2015; which are hereby incorporated by reference herein for all purposes.

TECHNICAL FIELD

The present disclosure relates to methods and systems for designing circuits with latches and/or flip-flops.

BACKGROUND

While latches and flip-flops are similar elements, they are not identical. A latch is generally level-sensitive, whereas a flip-flop is edge-sensitive. That is, when a latch is enabled it becomes transparent, while a flip flop's output only changes on a single type of clock edge which can be either positive or negative.

SUMMARY

Embodiments of the present disclosure may include a system or circuit for scanning a circuit, the embodiments including flip-flops, latches interleaved between the flip-flops, multiplexers configured to propagate scan data between the flip-flops and latches, and scan logic configured to control the multiplexers to load test data into the flip-flops and latches. In combination with any of the above embodiments, a first pair of latches may be interleaved between a first pair of flip-flops. In combination with any of the above embodiments, a variable number of latches are interleaved between a plurality of pairs of flip-flops. In combination with any of the above embodiments, a single latch is interleaved between a pair of flip-flops. In combination with any of the above embodiments, no latches are interleaved between a pair of flip-flops.

Embodiments of the present disclosure includes systems and circuits for scanning a circuit comprising a plurality of flip-flops and latches. The embodiments may include a first flip-flop, a second flip-flop, a first latch arranged between the first flip-flop and the second flip-flop, a second latch arranged between the first flip-flop and the second flip-flop, and a first multiplexer configured to couple an output of the first flip-flop with an input of the first latch. The first multiplexer may include a first input for receiving input for the first latch and a second input coupled with output of the first flip-flop. The embodiments may include a second multiplexer configured to couple an output of the first multiplexer to the second latch. The second multiplexer may have a first input for receiving input for the second latch and a second input coupled with output of the first multiplexer. The embodiments may include a third multiplexer configured to coupled output of the second multiplexer with an input of the second flip-flop and scan logic configured to control the first, second, and third multiplexers to load test data into the first flip-flop and into the first latch and the second latch from the first flip-flop.

In combination with any of the above embodiments, wherein the scan logic may be further configured to pass output of the first flip-flop, second flip-flop, the first latch, and the second latch into portions of the circuit to be tested. In combination with any of the above embodiments, the first latch and the second latch may be enabled with different enable signals.

In combination with any of the above embodiments, the embodiments may include a third flip-flop, a third latch arranged between the first flip-flop and the third flip-flop, a fourth multiplexer, and a fifth multiplexer, wherein the fourth multiplexer is configured to couple an output of the third flip-flop to an input of the third latch and to an input of the fifth multiplexer and the fifth multiplexer is configured to couple an output of the fourth multiplexer to an input of the first flip-flop. In combination with any of the above embodiments, the third latch may be the only latch connected between the third flip-flop and the first flip-flop. In combination with any of the above embodiments, the first latch and the second latch are the only latches connected between the first flip-flop and the second flip-flop.

In combination with any of the above embodiments, the embodiments may include a fourth flip-flop, wherein no latches are arranged between the second flip-flop and the fourth flip-flop. In combination with any of the above embodiments, the fourth multiplexer may be configured to couple an output of the second flip-flop to an input of the fourth flip-flop.

In combination with any of the above embodiments, the first flip-flop may be configured to perform as a lock-up latch for the first latch and the second latch. In combination with any of the above embodiments, the flip-flops and the latches may be configured to receive separate scan clock signals. In combination with any of the above embodiments, the first multiplexer and the second multiplexer may be configured to receive separate enable signals. In combination with any of the above embodiments, the scan logic may be further configured to route a first circuit logic coupled to an input of the first multiplexer, wherein the first circuit logic is configured to provide a signal to the first latch during non-scanning operation. In combination with any of the above embodiments, the scan logic may be further configured to cause loading of result data from the first flip-flop and the first latch, the result data to indicate processing of test data by the first circuit logic. In combination with any of the above embodiments, the scan logic may be further configured to route capturing first result data from the first flip-flop reflecting performance of the circuit to be tested. In combination with any of the above embodiments, the scan logic may be further configured to cause, after capturing the first result data from the first flip-flop, loading the same test data back into the first flip-flop. In combination with any of the above embodiments, the scan logic may be further configured to cause, after loading the same test data back into the first flip-flop, capturing second result data from the first latch reflecting performance of the circuit to be tested and storing the second result data into the first flip-flop. In combination with any of the above embodiments, the scan logic may be further configured to cause, after storing the second result data into the first flip-flop, simultaneously shifting out the second result data and shifting in new test data to the first flip-flop.

Embodiments of the present disclosure may include methods performed during the operation of any of the above systems or circuits.

DETAILED DESCRIPTION

Figure 1:
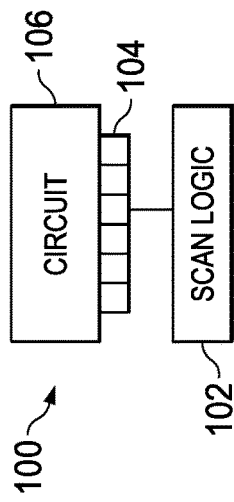
FIG. 1 is an illustration of an example system for scanning a circuit, according to embodiments of the present disclosure.

FIG. 1 is an illustration of an example system 100 for scanning a circuit. The circuit may include latches and flip-flops. The latches and flip-flops may be used to pass information into and out of the circuit, wherein the information is to be used in testing the circuit. System 100 may include any suitable number and kind of components. For example, system 100 may include scan logic 102. Scan logic 102 may specify a series of inputs that are to be applied through circuit interfaces 104 to the circuit 106 under test. Scan logic 102 may be implemented by, for example, analog circuitry, digital circuitry, instructions for execution by a processor, or any other suitable mechanism. Circuit interfaces 104 may include, for example, test harnesses, leads, interconnects, or other suitable mechanisms to connect to pins of circuit 106 under test. Circuit 106 may include circuitry that is included within or on, for example, a die, chip, package, substrate, or any other suitable mechanism for hosting circuit 106.

In one embodiment, circuit 106 may include latches and flops (flip-flops). The latches and flops may be connected in series to form any suitable circuit construct, such as a shift register, microprocessor, execution, unit, etc. Moreover, the latches and flops may interface other portions of circuit 106 that are to be tested. Each such latch or flop may be implemented in any suitable manner. In another embodiment, a previous version of circuit 106 that had the same functional output as circuit 106 was modified to replace one or more flops with one or more latches. However, as discussed below, even if the functionality of a flop or a latch might be performed conversely by the other of a flop or a latch, testing a design with a flop and a latch require different considerations.

Performance of scanning or testing of circuit 106 may include applying, through circuit interfaces 104, specified inputs into portions of circuit 106 and evaluating outputs received through circuit 106 resulting from such inputs and the operation of circuit 106. The inputs may be specified by scan logic 102. The results of scanning or testing may be stored in a computer-readable medium for later evaluation by a suitable entity, or evaluated by scan logic 102. Comparison of the results against expected results may provide insight whether circuit 106 includes any defects. The inputs to be applied to circuit 106 and the expected results from circuit 106 may depend upon a particular model or makeup of circuit 106. Accordingly, an appropriate set of test vectors may be applied for a given instance of circuit 106.

In one embodiment, testing and scanning an instance of circuit 106 that includes a latch may be more difficult than an instance of circuit 106 that includes only flops. This may occur because when a latch remains open during an "enabled" period of its operation, data feedthrough will not be made to multiple latches. One work-around to this problem is to keep the latches transparent, wherein the gate for the latch is kept at a logic one, or constantly activated. However, using this approach, which might be used for a design with relatively few latches, may cause significantly poor coverage in design for most applications. For example, an 8-bit microcontroller may have a large number of latches. Not latches in such a device will be actually tested during the scanning. Furthermore, if phased clocks are used for shifting in data to the latches, then based on number of phases, multiple latches may get loaded with the same data. For example, a number of latches with the same data may be equivalent to a number of phases of the clock. This may cause difficulty in controlling the test vectors. Also, use of phased clocks during capture of output data may cause successive captures of different phases to change according to a previous capture, making debugging difficult. In one embodiment, system 100 may solve one or more of these problems with reduced area on die and time overhead while achieving testability approaching that of a circuit with all flops.

In one embodiment, system 100 may be used to test designs of circuit 106 that include relative equivalent amounts of flops and latches, wherein the total combination of flops and latches are approximately fifty percent of each of flops and latches. For example, various instances of circuit 106 may include 48% or 45% flops, as compared to 52% or 55% latches. In a further embodiment, a design of circuit 106 may be modified to convert excess latches (or flops) to flops (or latches) to achieve an equal number of latches and flops. Design of circuit 106 may take into account size of latches and flops. For example, latches may be smaller on a surface die than flops. Thus, latches may be preferable to flops. However, testing of a circuit that is entirely made up of flops may be easier than testing of latches, as described above. In another embodiment, system 100 may be configured to test a design of circuit 106 that includes an equal number or roughly equal number of flops and latches as efficiently or nearly as efficiently as a circuit that is made up of all flops (as opposed to any latches).

In one embodiment, system 100 may perform scanning on flops or latches by using a shift-in-vector for sequential elements (flops or latches), wherein data is populated to a tested entity. In another embodiment, system 100 may perform scanning on flops or latches by fanning out the shifted-in-vector to other elements. In yet another embodiment, system 100 may perform scanning on flops or latches by capturing a snapshot of data, or a mission mode. In another embodiment, system 100 may perform scanning on flops or latches by shifting out the captured data. Circuit 106 may be designed to be tested so that element layouts avoid using latches for any of these steps except fanning out values. According to various embodiments, it is proposed to make use of available flops to act as lock up latches for the latches. According to various embodiments, real life practical designs can be achieved with half the number of flops to help solve various problems of using latches.

Latches might not efficiently shift in data, capture or shift out data. Latches are able to fan out the vector to the whole circuit as long as the latch somehow receives the vector. Flops and latches may be arranged in circuit 106 so that flops in the design may assist the latches in the remaining 3 functions (shift in/shift out and capture) with minimum time and area overhead and minimum loss of coverage.

Figure 2:
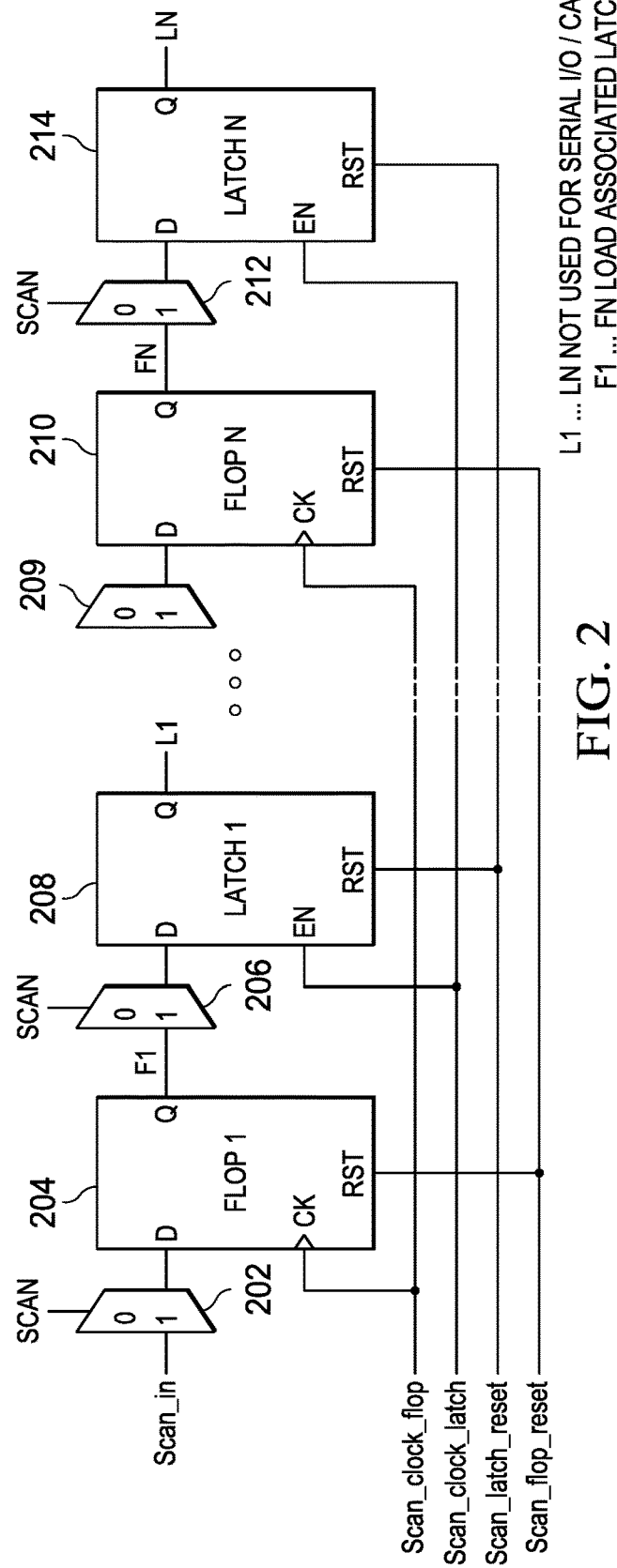
FIG. 2 illustrates an example of parts of a circuit that may be tested, according to embodiments of the present disclosure.

FIG. 2 illustrates an example embodiment of part of a circuit that may be tested by system 100, according to embodiments of the present disclosure. FIG. 2 may illustrate wiring for test and scanning, and may reflect some modifications of a previous instance of circuit 106. For example, for a given series of elements that can be implemented by flops or latches in circuit 106, flops and latches may be interleaved on a 1:1 basis as shown in FIG. 2. Flops 204, 210 may be staged in advance of respective ones of latches 208, 214. Flops 204, 210 and latches 208, 214 may be controlled through an overall scan signal, a scan clock for flops, a scan clock for latches, a reset signal for latches, and a reset signal for flops. The overall scan signal may be applied to respect multiplexers 202, 206, 209, 212 for each element. The scan signal may enable, through respective multiplexers, the transfer of data between elements.

In one embodiment, flops 204, 210 may receive their scan data from a scan_in signal. However, latches 208, 214 may receive their scan_in information as processed from respective flops 204, 210. Latches might only receive their scan_in information from flops. Latches may be unable to capture, and so their output might not be used in scan connections. Flops 204, 210 might now act as a lockup latch to respective latches 208, 214, thereby stopping a feedthrough and without the need for adding extra lock up latches. Latches 208, 214 might now operate on a single phase clock with no skew balancing required between latch clocks.

Figure 3:
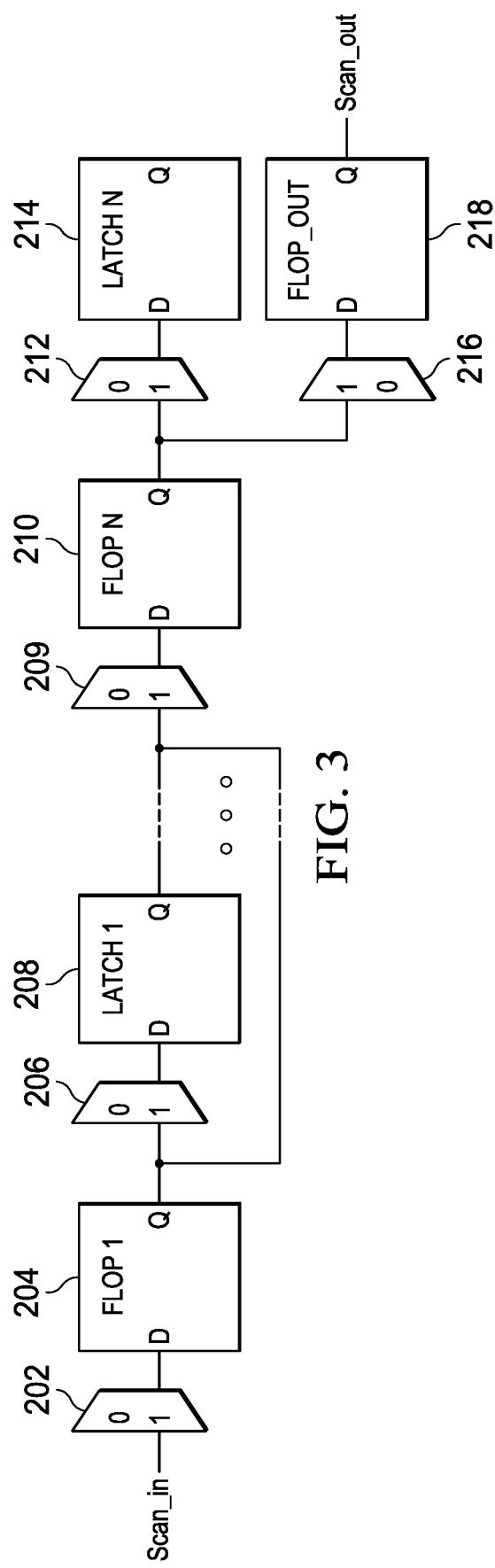
FIG. 3 illustrates an example of other parts of a circuit that may be tested, according to embodiments of the present disclosure.

FIG. 3 illustrates an example embodiment of other parts of a circuit that may be tested by system 100, according to embodiments of the present disclosure. FIG. 3 may illustrate wiring for test and scanning, and may reflect some modifications of a previous instance of circuit 106. FIG. 3 may illustrate changes made to the circuit of FIG. 2.

In FIG. 3, flops 204, 210 may be stitched together, along with another, similarly configured output flop 218. Flops 204, 210, 218 may be stitched together in a straight chain by routing the output of a given flop to the next flop (in addition to the corresponding latch). Shifting scan or test bits is performed only by flops, so the chain connection is made between the flops. The output of a given flop may be routed to the next flop through that next flop's multiplexer, such as multiplexer 209, 216.

Figure 4:
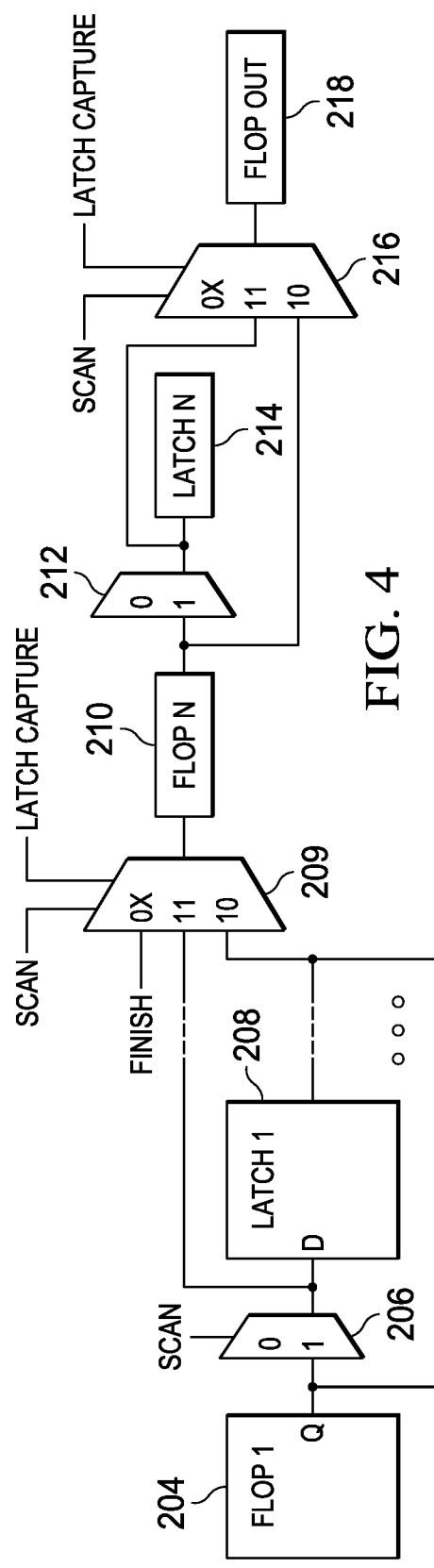
FIG. 4 illustrates an example of further parts of a circuit that may be tested, according to embodiments of the present disclosure.

FIG. 4 illustrates an example embodiment of further parts of a circuit that may be tested by system 100, according to embodiments of the present disclosure. FIG. 3 may illustrate wiring for test and scanning, and may reflect some modifications of a previous instance of circuit 106. FIG. 4 may illustrate changes made to the circuit of FIG. 3.

While latches cannot be used for capturing data in the same manner as a flop, the output of such latches should be evaluated with respect to the scan or test bits that are passed into the latches and the expected output. Accordingly, instead of 2:1 multiplexers for each flop, a 3:1 multiplexer may be used. The third input of the multiplexer for the flop may be used to capture the latch input data that the latches cannot otherwise capture. This may be accomplished by routing the output of a latch multiplexer 206, 212 to one of the inputs of the next flop multiplexer 209, 216. The same vectors might be loaded again and the latch data captured in the second iteration. Accordingly, the flops may be enabled to perform shifting in data, capturing data, and shifting out data.

The 3:1 multiplexer may include an input for function_in (input from other portions of circuit 106, not shown), holding the value when applied to the flop and dependent upon the scan control signal, as also performed in the 2:1 multiplexers. The 3:1 multiplexer may include an additional mux control input for capturing latch data. The 3:1 multiplexer may include two inputs to be controlled by the latch capture signal when the scan signal is also enabled. When latch capture is not enabled and the scan capture is enabled, the multiplexer will route the previous flop data to the flop. When latch capture is enabled and the scan capture is enabled, the multiplexer will route the previous latch multiplexer output to the flop.

Figure 5:
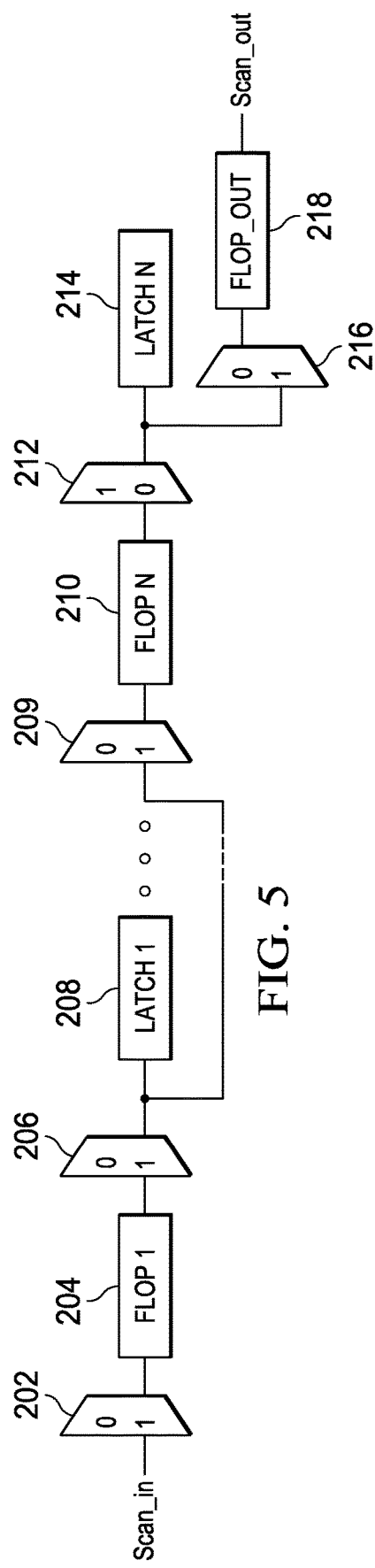
FIG. 5 illustrates an example of still further parts of a circuit that may be tested, according to embodiments of the present disclosure.

FIG. 5 illustrates an example embodiment of still further parts of a circuit that may be tested by system 100, according to embodiments of the present disclosure. FIG. 5 may illustrate wiring for test and scanning, and may reflect some modifications of a previous instance of circuit 106. FIG. 5 may illustrate changes made to the circuit as presented in previous figures.

In FIG. 5, the two inputs on a given latch multiplexer also are the two inputs to the next flop multiplexer. This may be optimized by using the output of the latch multiplexer and reducing the flop multiplexer back to a 2:1 multiplexer. The multiplexer select signals and scan clocks are coordinated to control the data flow as desired.

Figure 6:
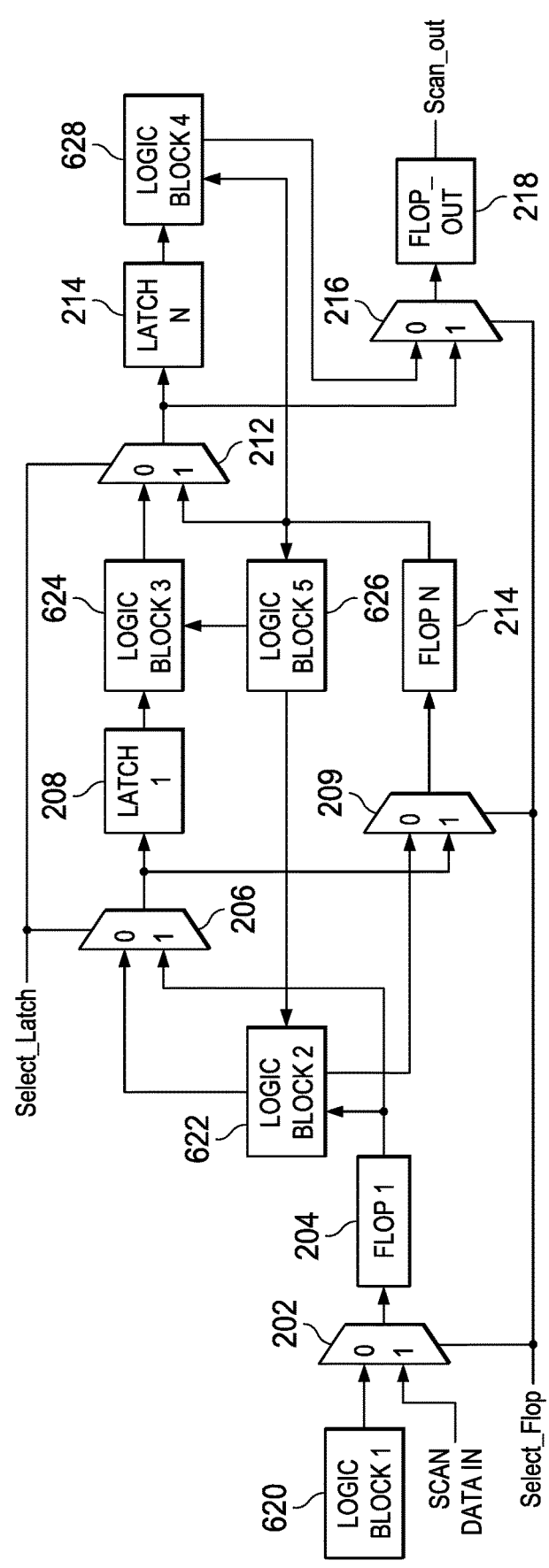
FIG. 6 illustrates an example of parts of a circuit including flops, latches, and other circuitry that may be tested, according to embodiments of the present disclosure.

FIG. 6 illustrates an example embodiment of parts of a circuit including flops, latches, and other circuitry that may be tested by system 100, according to embodiments of the present disclosure.

In particular, FIG. 6 illustrates how latches and flops may be tested while such latches and flops are integrated into other portions of circuit 106. For example, flops 204, 214 and latches 208, 214 may be interconnected with various other digital or analog circuitry of circuit 106. Flops 204, 214 and latches 208, 214 may consume or produce values that are imported from or exported to such circuitry. Such circuitry may be represented in FIG. 6 by logic blocks 620, 622, 624, 626, 628. Although a particular arrangement of logic blocks 620, 622, 624, 626, 628 is shown with respect to flops 204, 214 and latches 208, 214, the illustration of FIG. 6 is presented as but one example and should not be considered limiting. Any suitable number or kind of logic blocks interfacing with flops 204, 214 and latches 208, 214 may be used, just as any suitable number of flops and latches may be used. Moreover, any suitable arrangement of logic blocks, flops, and latches may be used. The particular logic blocks 620, 622, 624, 626, 628 represent the functionality that circuit 106 is to perform. System 100 may test flops 204, 214 and latches 208, 214 with respect to their interaction with such logic blocks. For example, logic block 620 may provide a data bit to flop 204. Such a data bit may be multiplexed with respect to scan data in. In another example, flop 214 may export a data bit to logic block 626, which may in turn export a data bit to latch 214.

Each multiplexer 202, 209, 216 associated with flops may have a specified trigger signal, scan_flop. Likewise, each multiplexer 206, 212 associated with latches may have a specified trigger signal, scan_latch.

Figure 7A:
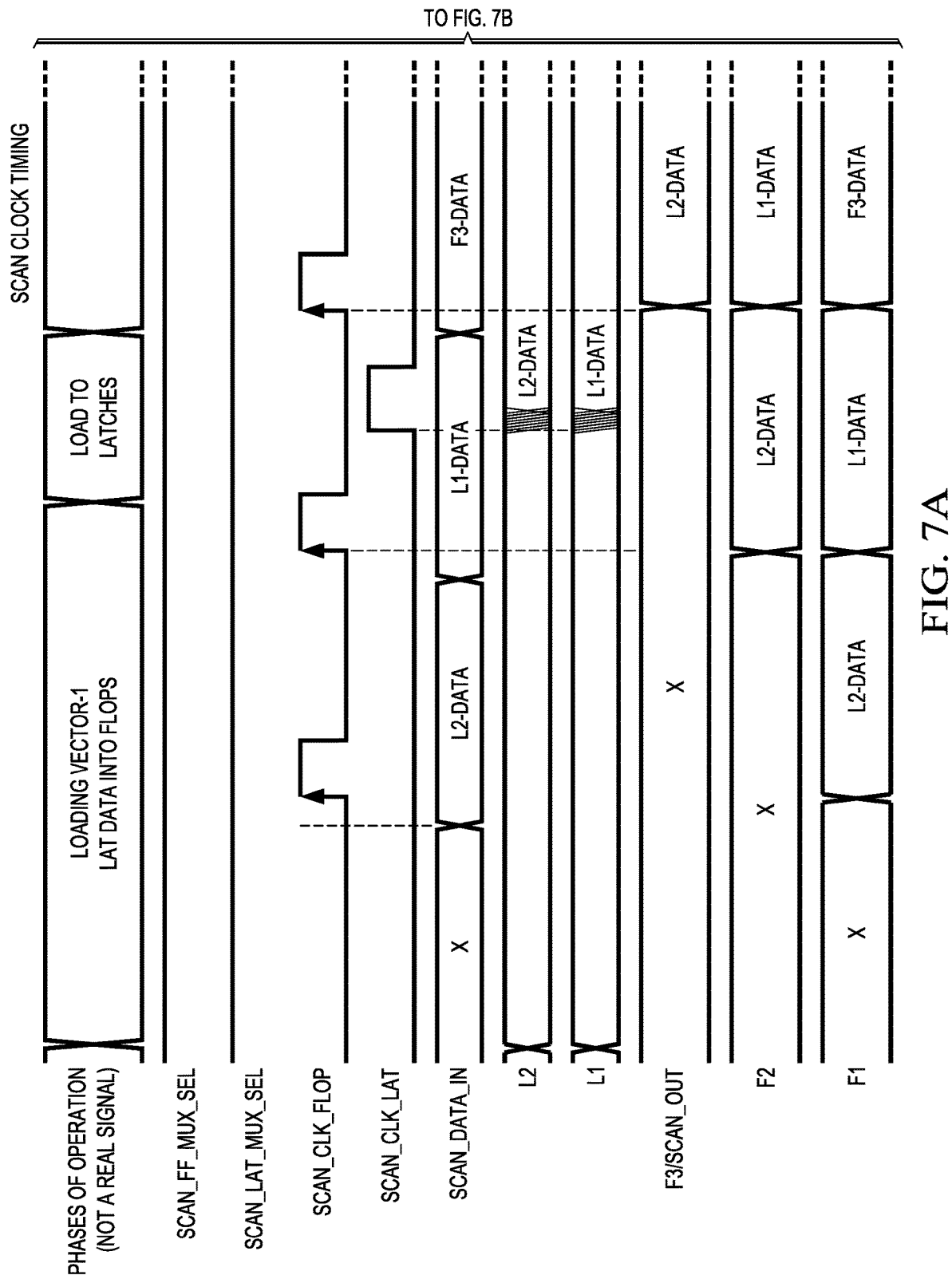
FIGS. 7A, 7B, and 7C illustrate an example timing diagram for testing a circuit, in accordance with embodiments of the present disclosure.
Figure 7B:
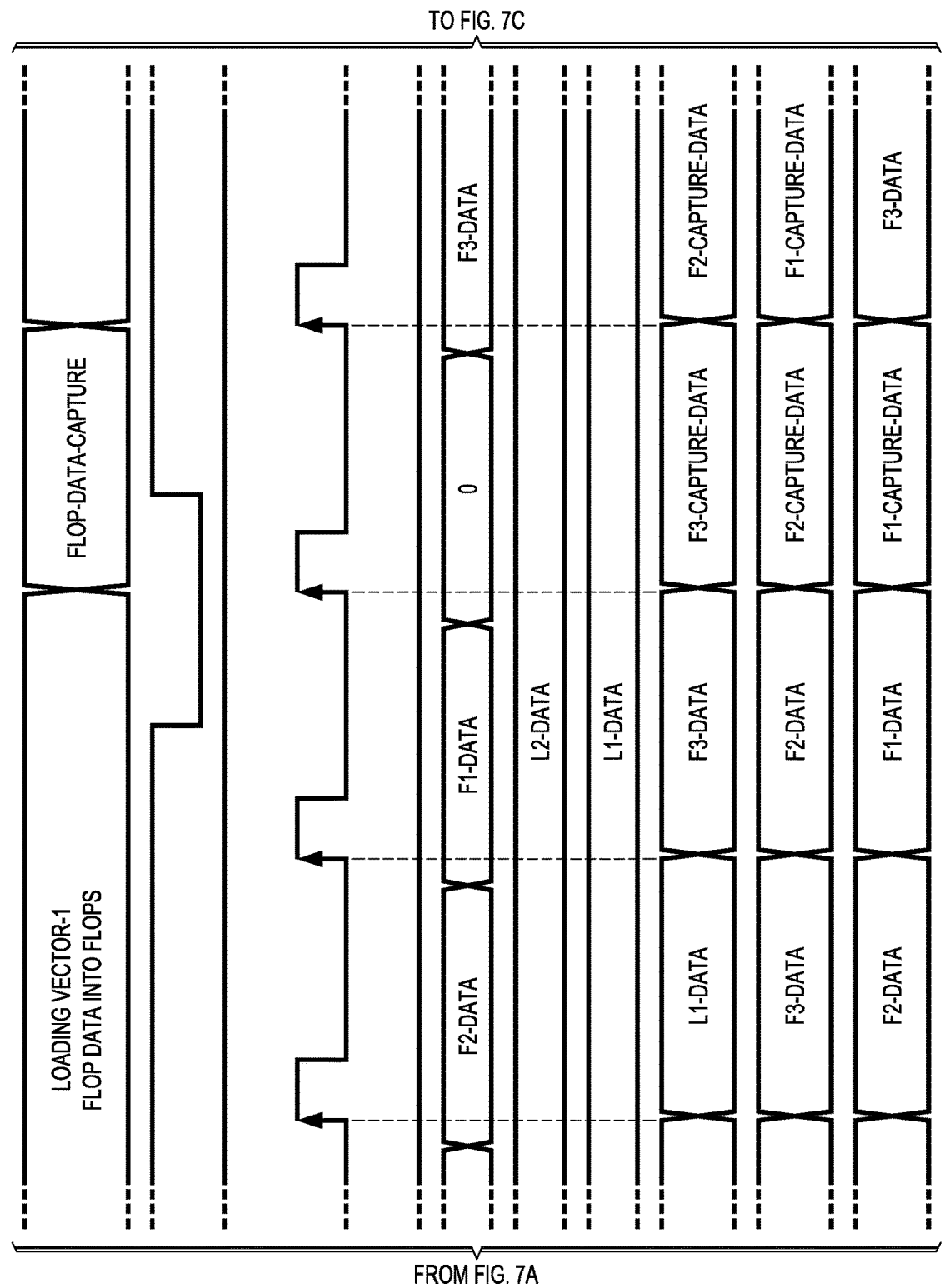
Figure 7C:
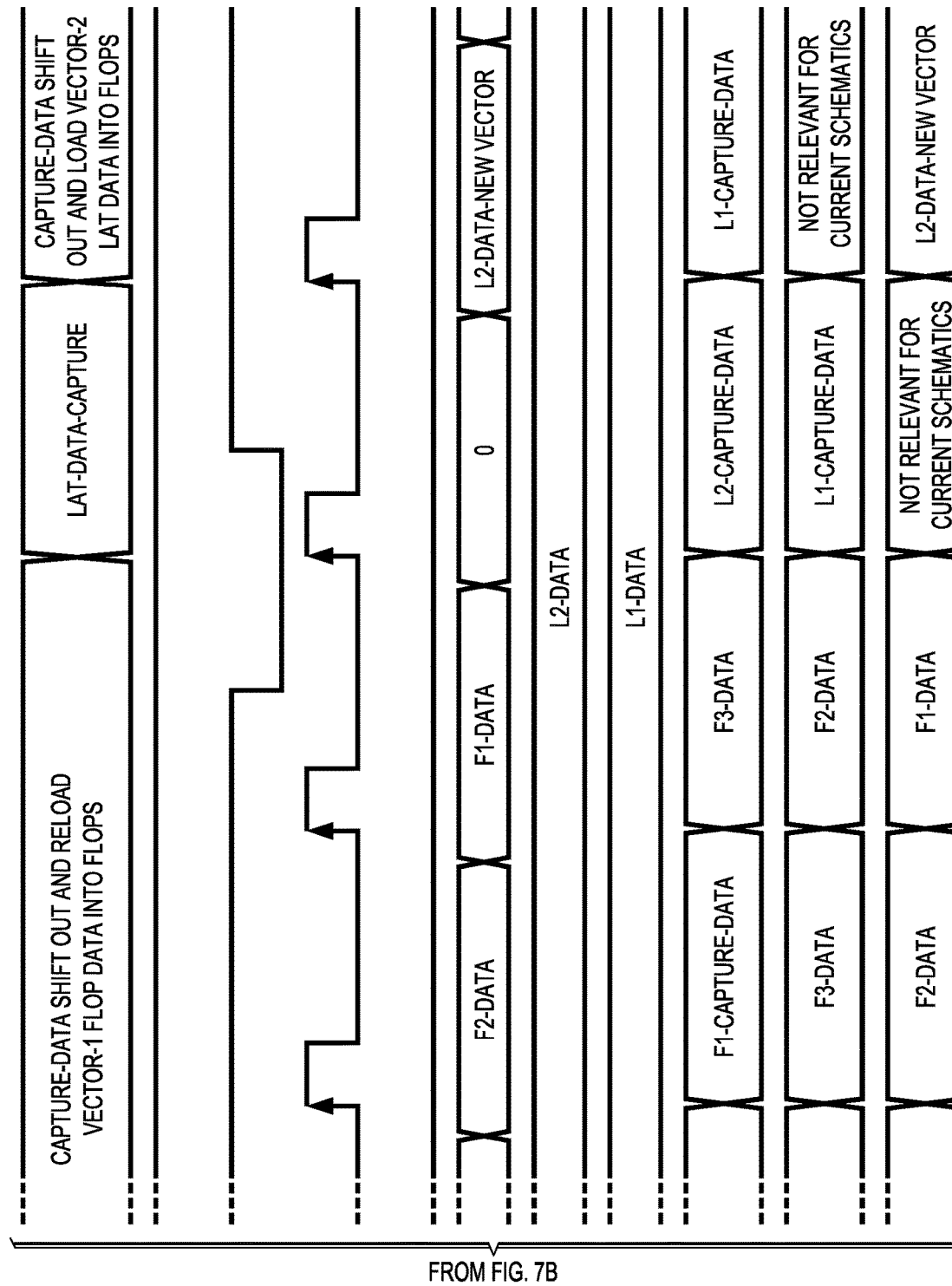

FIGS. 7A, 7B, and 7C illustrate an example timing diagram, in accordance with embodiments of the present disclosure. The timing diagram of these figures may illustrate operation of testing of circuit 106 as shown in FIG. 6 as performed by system 100.

A scan_ff_mux_sel signal is shown, which may illustrate operation of select_flop from FIG. 6.

A scan_lat_mux_sel signal is shown, which may illustrate operation of select_latch from FIG. 6.

A scan_clk_flop signal is shown, which may illustrate operation of scan_clok_flop routed into each of the flops. The connection of this signal was shown in FIG. 2.

A scan_clk_lat signal is shown, which may illustrate operation of scan_clok_latch routed into each of the flops. The connection of this signal was shown in FIG. 2.

A scan_data_in signal is shown, which may illustrate operation of scan_data_in to populate flops with test or scan bits.

L1 and L2 signals are shown, which may illustrate the output of latches 208, 214. An F3/scan_out signal is shown, which may illustrate the output of flop 218. F1 and F2 signals are shown, which may illustrate the output of flops 204, 214.

In operation, during a first phase of testing circuit 106, data is loaded into the flops. Flops can shift in and shift out data serially. In the first phase, the flops take in test data. The flops are first loaded with vector data intended for the latches. Flops 204, 214 take in data to be used by latches 208, 214, respectively. SCAN_FF_MUX_SEL is set to a logical one signal, such that the multiplexer selects the scan_data_in pin. The lops are all serially connected like a serial shift register. SCAN_CLK_FLOP may clock the flops to load the vector data (meant for latches) into the flops serially. SCAN_CLK_LAT might inactive, unused, or irrelevant during this phase. SCAN_DATA_IN is an input pin that is supplied with the vector data from outside circuit 106 from scan logic 102.

During a second phase of testing circuit 106, data in flops 204, 214 are loaded into latches 208, 214, respectively, in parallel. This may occur in a single clock cycle. The value of SCAN_DATA_IN, SCAN_FF_MUX_SEL and SCAN_CLK_FLOP may be irrelevant, as flops might be unclocked during this phase. The value of SCAN_LAT_MUX_SEL may be set to a logical one, wherein latch multiplexers 206, 212 may select the select_in pin, allowing data in the flops to be the data input to the latches, thus loading the data from flops to the latches. SCAN_CLK_LAT may be clocked once to load all the latches simultaneously.

During a third phase of testing circuit 106, the flops may be loaded with their own information. This may occur after the flops have been used to populate data to the latches. The control signals are similar to the first phase but the SCAN_DATA_IN input pins shift in a new set of vector data intended to be loaded in flops 204, 214.

SCAN_FF_MUX_SEL may be set to a logical high value. Accordingly, flop multiplexers may select the scan_in pins. SCAN_LAT_MUX_SEL may be set to a logical high value, wherein latch multiplexers may select the scan_in pin. These two signals may insure that all the flops are serially connected like a serial shift register. SCAN_CLK_FLOP may clock the flops to load the vector data (meant for flops) into the flops serially. SCAN_CLK_LAT might be inactive. SCAN_DATA_IN may include vector data to be used in testing.

During a fourth phase of testing circuit 106, resulting data may be captured from the flops. The result may be loaded into the flops. The flops may be loaded with the captured at the rising edge of the clock diagram.

SCAN_FF_MUX_SEL may be held to a logical zero, so that the flop multiplexers select functional data for routing. The value of SCAN_LAT_MUX_SEL, SCAN_CLK_LAT, and SCAN_DATA_IN may be irrelevant, as latches are not clocked in the phase, the flop multiplexers are selecting functional data, and the flops are not inputting data from SCAN_DATA_IN. SCAN_CLK_FLOP may clock the flops once to capture the functional data in into the flops.

During a fifth phase of testing circuit 106, data captured by the flops may be serially shifted out while original flop vector data is shifted in again. Thus, the capture data to be evaluated may be output and the flop data reloaded. At the conclusion of the fifth phase, all flops and latches may be returned to a state akin to the third phase, before the flop data is captured. The captured data appears at the output of output flop 218, while flops 204, 214 are loaded with the vector again. The vector is loaded again in order to complete a capture for latch data. The latches were not clocked since the first load, so they do not require loading again.

SCAN_FF_MUX_SEL may be set to a logical one value, such that the flop multiplexers select the scan_in pin. SCAN_LAT_MUX_SEL may be set to a logical one value, such that latch multiplexers select the scan_in pin. These two signals make all flops connected in a manner like a serial shift register. SCAN_CLK_FLOP may clock the flops to load the vector data into the flops serially again while shifting out the captured data from the other end of the chain. SCAN_CLK_LAT might be inactive during this phase.

During a sixth phase of testing circuit 106, functional data at the input of the latches may be captured into the flops. The flops may be loaded with captured data at the rising edge of the clock timing diagram. The functional data at the input of the latches may be later output and compared against expected values.

SCAN_FF_MUX_SEL may be set to a logical one value, such that the flop multiplexers select the scan_in pin. SCAN_LAT_MUX_SEL may be set to logical zero, so that the combination of multiplexers selects functional data into the input of flop. SCAN_CLK_FLOP may clock the flops once to capture the latches' functional data in into the flops. SCAN_CLK_LAT might be inactive during this phase.

In a seventh phase of testing circuit 106, data captured by the flops (from the latches) may be serially shifted out while the next vector of test data is loaded. The captured data is output from output flop 218 while flops 204, 214 are loaded with the next vector of data.

SCAN_FF_MUX_SEL may be set to a logical one, such that flop multiplexers select the scan_in pin. SCAN_LAT_MUX_SEL may be set to a logical one, such that latch multiplexers select the scan_in pin. SCAN_CLK_FLOP clocks the flops to load the new vector data into the flops serially again while shifting out the captured data from the other end of the chain. SCAN_CLK_LAT is inactive during this phase.

Figure 9:
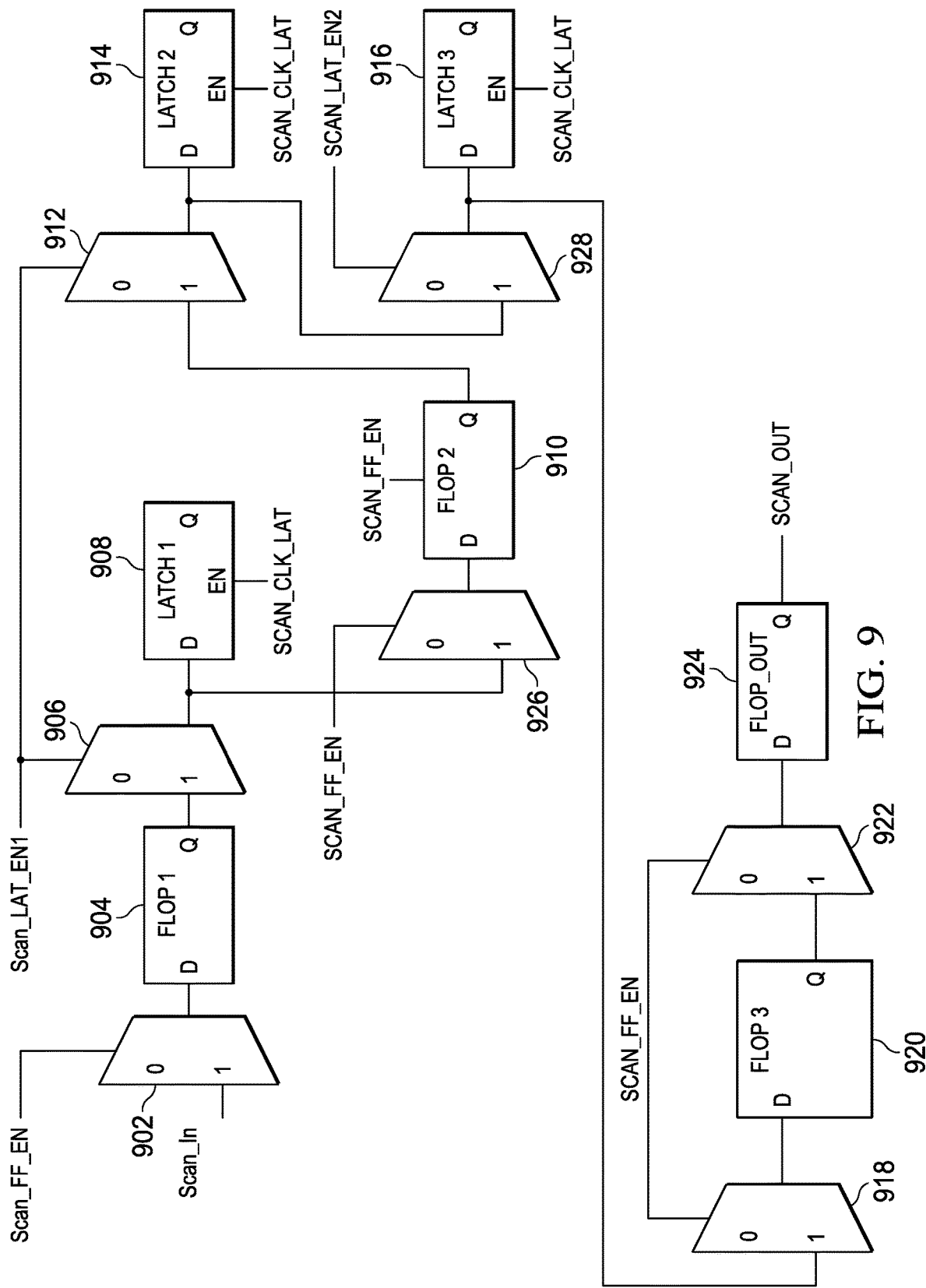
FIG. 9 illustrates scan stitching with functional logic with more latches than flops, according to embodiments of the present disclosure.
Figure 10A:
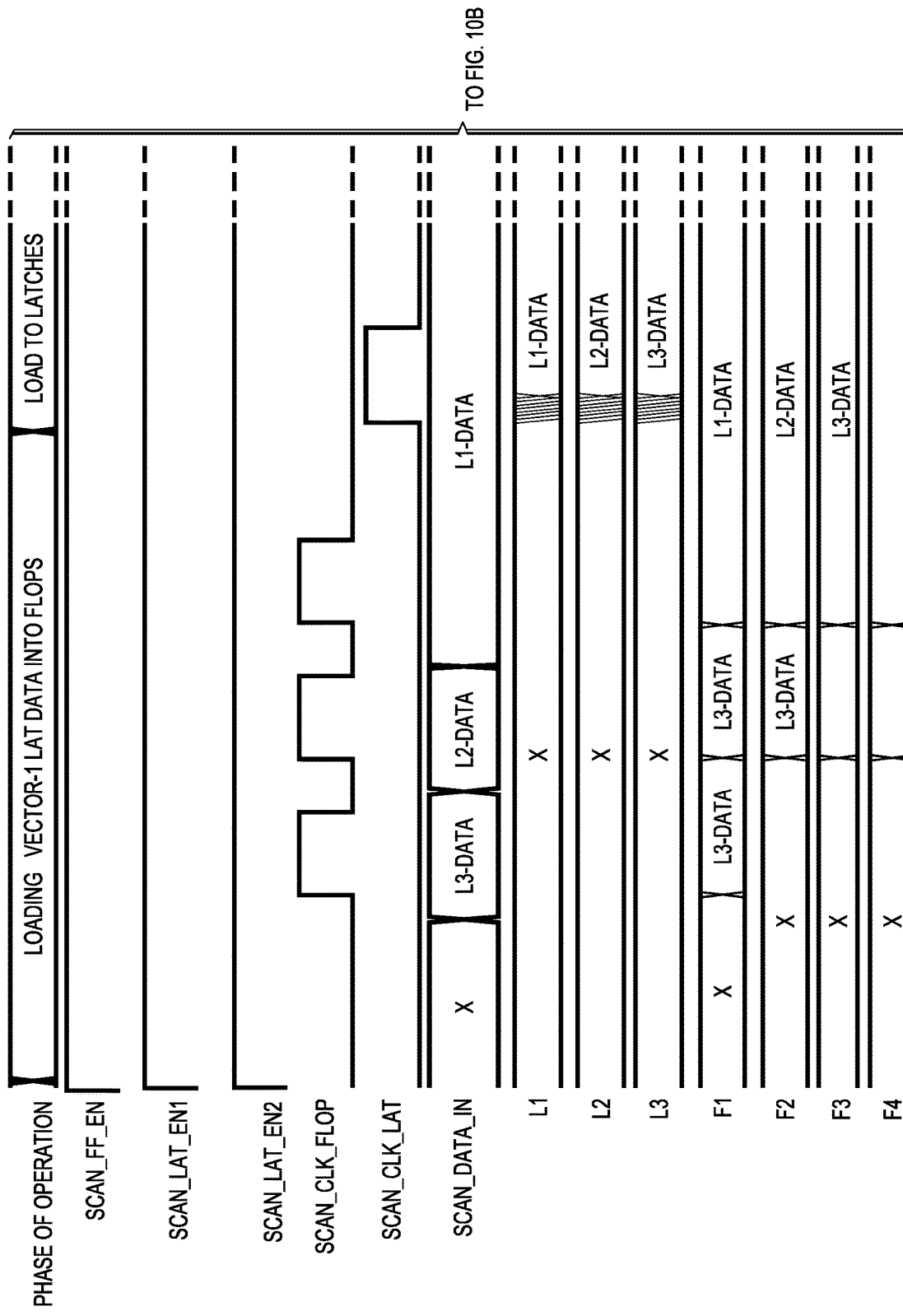
FIGS. 10A-10D illustrate a timing diagram for example operation of the circuit of FIG. 9, according to embodiments of the present disclosure.
Figure 10B:
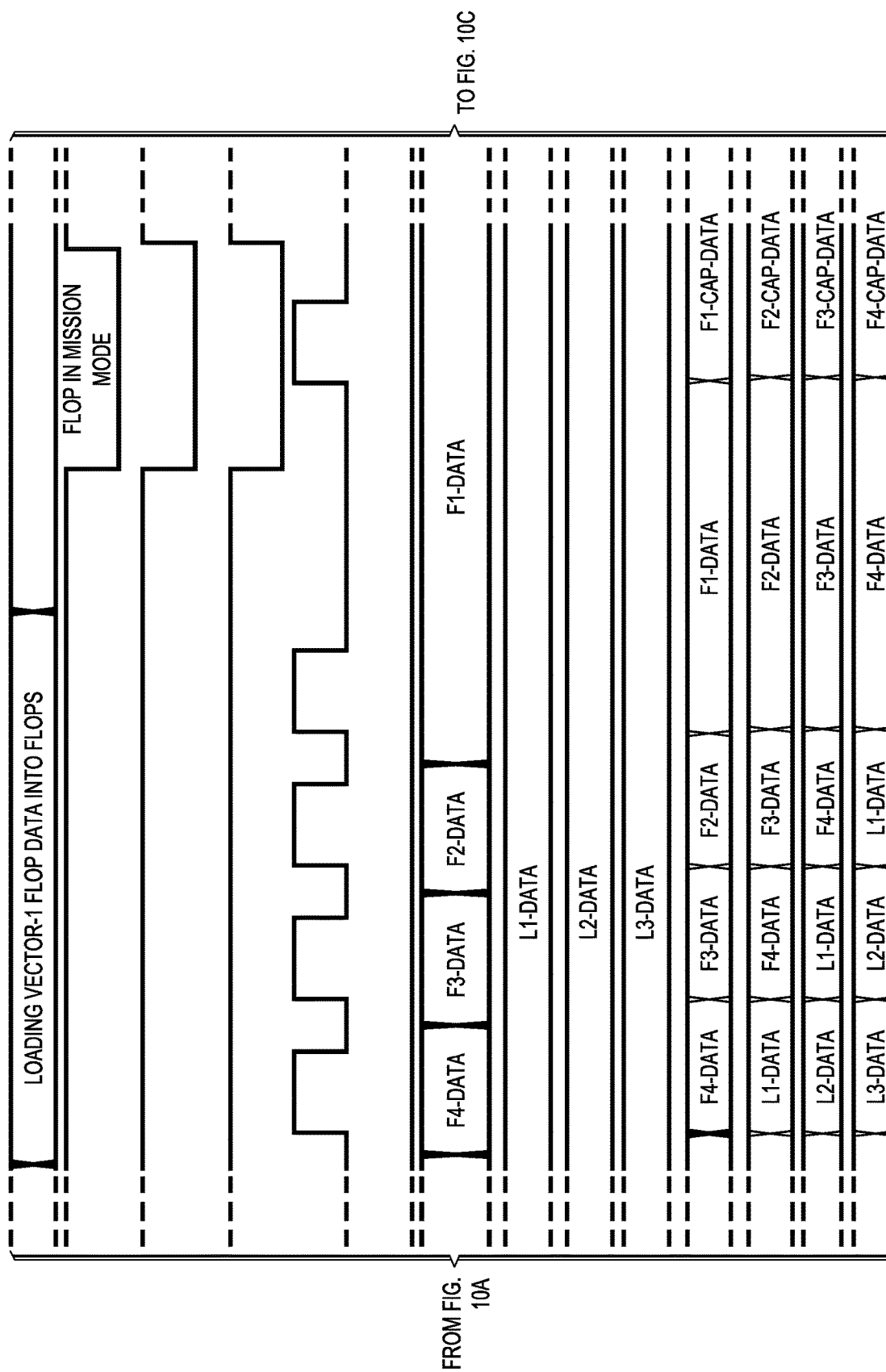
Figure 10C:
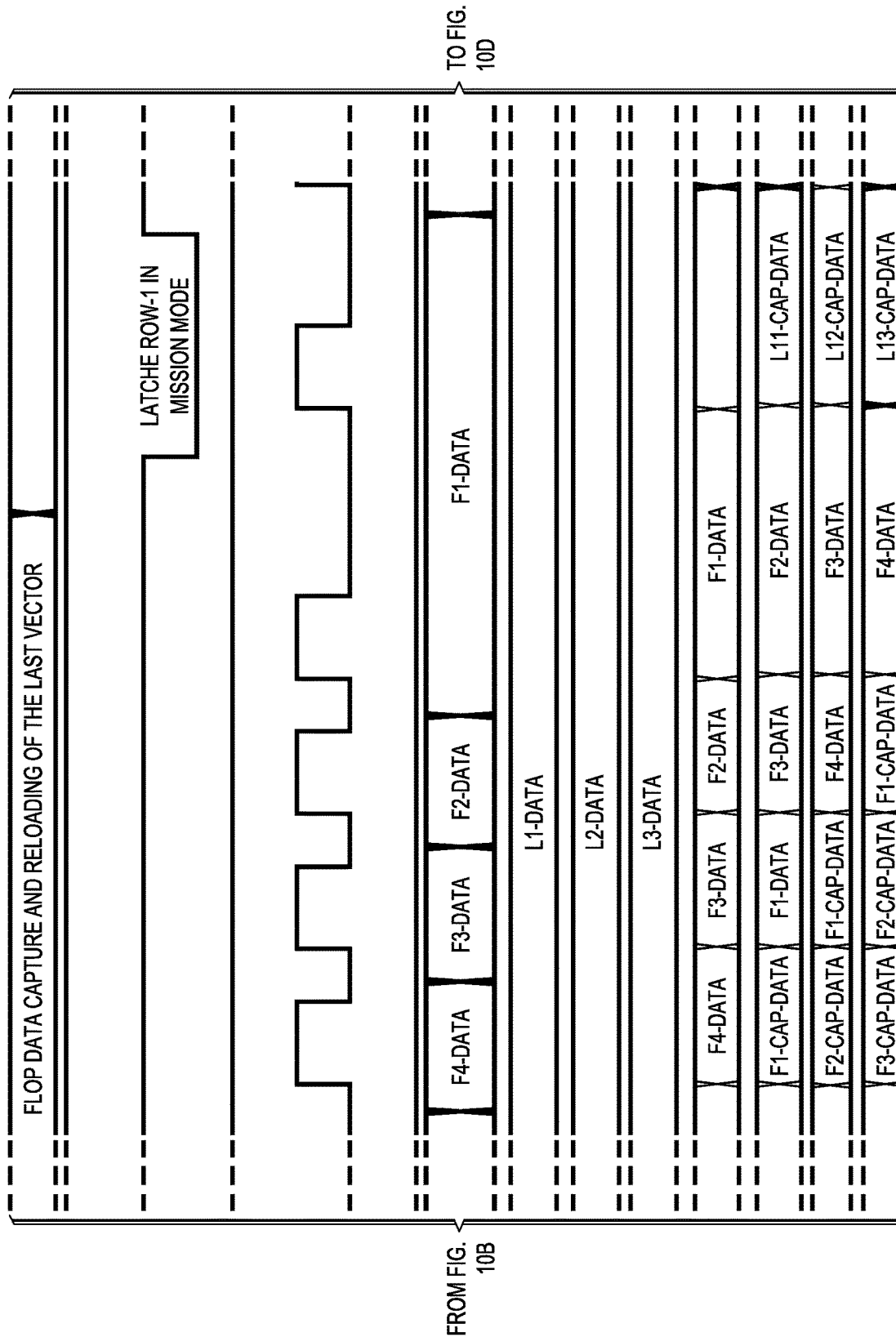
Figure 10D:
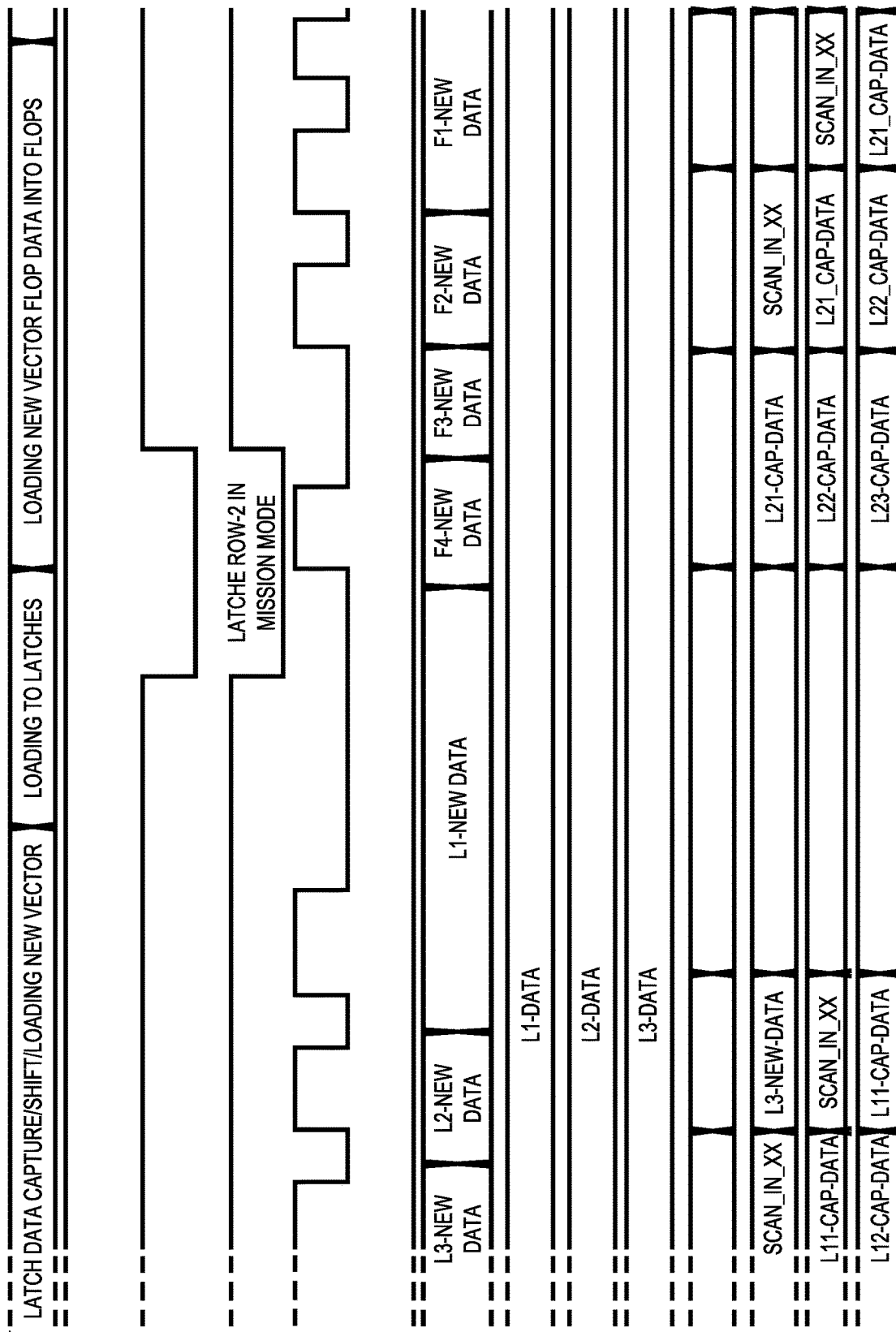

The solutions above may be applicable to designs with approximately 50% latches. However, scan routing may be inefficient and routing congestion may occur. In such solutions, about as many latches may be included in the scan chain as there were flops. Other, remaining latches might not be used for a scan test. However, in some microcontrollers, there may be many more latches available than flops. FIG. 9 illustrates scan stitching with functional logic with more latches than flops, according to embodiments of the present disclosure.

In one embodiment, instead of a single latch interleaved between a master and a slave flop and flops stitched in a straight line, two or more latches may be interleaved between a master and a slave flop. In a further embodiment, a different number of latches may be interleaved between different master-slave flop pairs. For example, between any given master-slave flop pair, there may be zero, one, two, or three latches interleaved between the given master-slave flop pair. Such variation may exist among master-slave flop pairs on the same system. In another embodiment, multiple such latches may be selectively used by a test application through separate latch scan enable signals provided for the variations in the number of latches between a given master-slave flop pair. The variable number of latches between any given master-slave flop pair may be set by selectively applying the enable signal. A scan router testing the circuit may decide which latches to interleave and how many latches are to be interleaved between a given master-slave flop pair.

While FIG. 9 illustrates an example embodiment of parts of a circuit including flops and latches that may be tested by system 100 according to embodiments of the present disclosure, other host circuitry is not shown. The parts of the circuit may include multiplexers 902, 906, 912, 926, 928, 918, and 922, which may be implemented according to any of the multiplexers described above. The parts of the circuit may include flop 1 904, flop 2 910, flop 3 920, and flop_out 924, which may be implemented according to any of the flops described above. The parts of the circuit may include latch 1 908, latch 2 914, and latch 3 916, which may be implemented according to any of the latches described above. Other parts of the circuit, not shown, may include circuit portions similar to those implemented in the logic blocks of FIG. 6. While FIG. 6 illustrated example logic blocks and connections among other elements of the circuit therein, these are mere examples and any suitable kind, number, and arrangement of logic blocks may be used within the context therein or within the context of FIG. 9. Such logic blocks may be connected to, for example, the "0" input of the multiplexers, the output of the latches, or the output of the flops. Moreover, such logic blocks may be connected to one another and may feed back within the flow of the circuit of FIG. 9. The logic blocks, implementing any suitable combination of analog and digital circuitry, may be the functionality that circuit 106 is to perform. System 100 may test the flops and latches with respect to their interaction with such logic blocks. For example, a logic block may provide a data bit to a flop, multiplexed at multiplexer 902 with respect to scan data in. In another example, flop 1 904 may export a data bit to a logic block, which may in turn export a data bit to latch 914 through multiplexer 912.

As discussed above, latches may be variably interleaved in the circuit of FIG. 9 among master-slave flop pairs. Master-slave flop pairs may include a cascaded, directly or indirectly, pair of flops. For example, flop 1 904 and flop 2 910 may be a master-slave flop pair. Moreover, flop 2 910 and flop 3 920 may be a master-slave flop pair, wherein flop 2 910 is the master of flop 3 920. Latch 1 908 may be interleaved between flop 1 904 and flop 2 910. Latch 2 and latch 3 may be interleaved between flop 2 910 and flop 3 920. No latches might be interleaved between flop 3 920 and flop_out 924.

Flops may be selected for propagation according to an associated multiplexer, wherein the multiplexer routes data from previous flops (or the data scanned in) through the "1" input, the multiplexer being gated according to a SCAN_FF_EN signal. The SCAN_FF_EN signal may be routed to each multiplexer directly in front of each flop, such as multiplexers 902, 926, 918, and 922. Furthermore, each flop may be clocked for scanning with a SCAN_CLK_FLOP signal, routed to each flop (not shown). The latches may be clocked for scanning with a SCAN_CLK_LAT signal, routed to each latch. In one embodiment, the latches may be enabled by routing a scan latch signal to multiplexers appearing in front of a given latch, the scan latch signal to determine whether to propagate a signal from circuit logic (if a 0) or from a previous flop (if a 1). In a further embodiment, different levels of latches may have independent latch enable signals routed to their respective multiplexers. For example, a SCAN_LAT_EN1 signal may be routed to multiplexer 912 in front of latch 2 914, while a SCAN_LAT_EN2 signal may be routed to multiplexer 928 in front of latch 3 916. The two latches may be between the same master-slave flop pair. In another example, the SCAN_LAT_EN1 signal may be routed to multiplexer 906 in front of latch 1 906.

FIGS. 10A-10D illustrate a timing diagram for example operation of the circuit of FIG. 9, according to embodiments of the present disclosure. Phases of operation of the circuit of FIG. 9 are shown, which may include loading vector data for the latch data into the flops; loading the data to latches; loading data into flops; loading vector data for the flop data into the flops; capturing flop data and reloading the last vector; capturing latch data, shifting out values, and loading a new vector; loading latches; and loading new vector data for flop data into the flops. SCAN_FF_EN, SCAN_LAT_EN1, SCAN_LAT_EN2, SCAN_CLK_FLOP, and SCAN_CLK_LAT signals are shown. Shaded regions may indicate portions of the timing diagram in which the value of the respective signal is not relevant to operation. SCAN_DATA_IN may illustrate when values for various latches and flops are scanned in as input to FLOP 1 904. L1, l2, L3 may illustrate data for the respective ones of the latches of FIG. 9. Likewise, F1, F2, F3, F4 (FLOP_OUT) may illustrate data for the respective ones of the flops of FIG. 9. The contents of the respective latches and flops are thus illustrated for any particular phase of operation. The flops may variously contain data for the other latches and flops as such data is propagated through the circuit. When read, the flops may include data that is to be read and verified, denoted, for example, as F1-CAP-data for data to be captured for flop 1 904. Different rounds of data may be denoted by an extra numeral. For example, latch 1 908 data in a first round of data may be denoted as L11, while latch 1 908 data in a second round of data may be denoted as L21.

Figure 11:
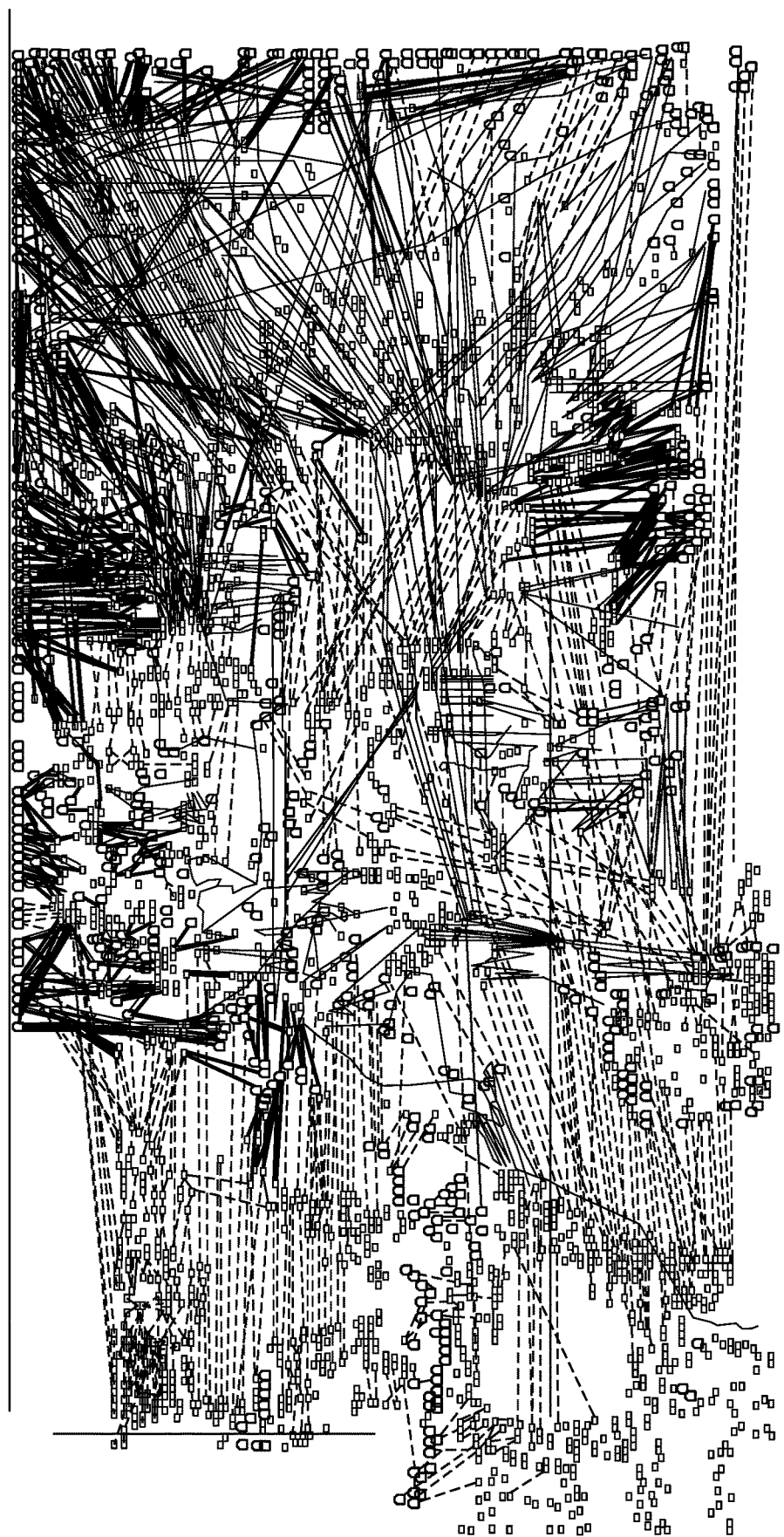
FIG. 11 illustrates example routing congestions when a single latch is interleaved between a given master-slave flop pair, according to embodiments of the present disclosure.

FIG. 11 illustrates example routing congestions when a single latch is interleaved between a given master-slave flop pair such as those in FIGS. 2-6. Such routing congestion may occur for an example device under test when various circuit logic is connected to the latches and flops.

Figure 12:
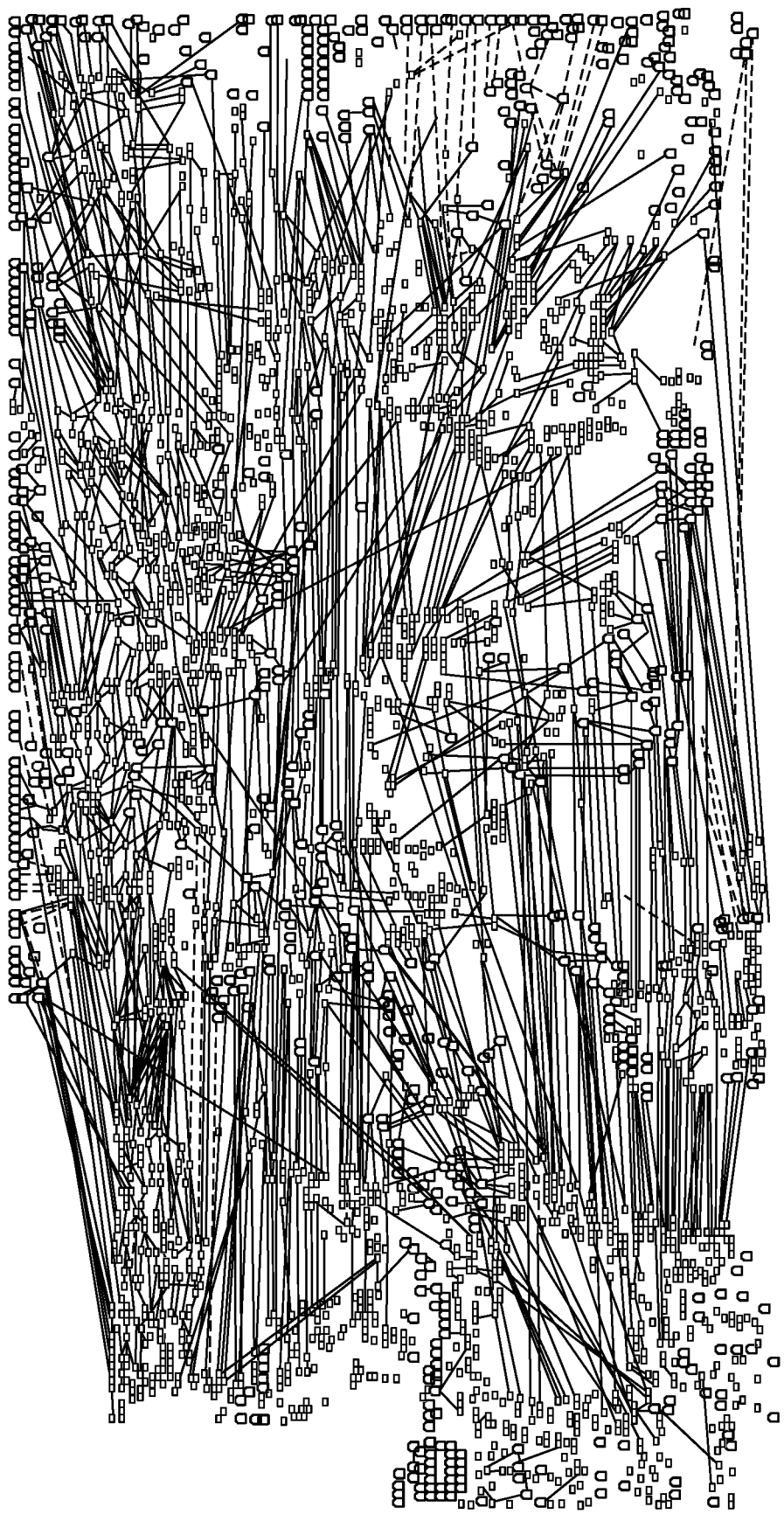
FIG. 12 illustrates example routing congestions when two latches are interleaved between a given master-slave flop pair, according to embodiments of the present disclosure.

FIG. 12 illustrates example routing congestions when two latches are interleaved between a given master-slave flop pair. Such routing congestion may occur for an example device under test when various circuit logic is connected to the latches and flops. The routing congestion is reduced when compared to FIG. 11.

Figure 13:
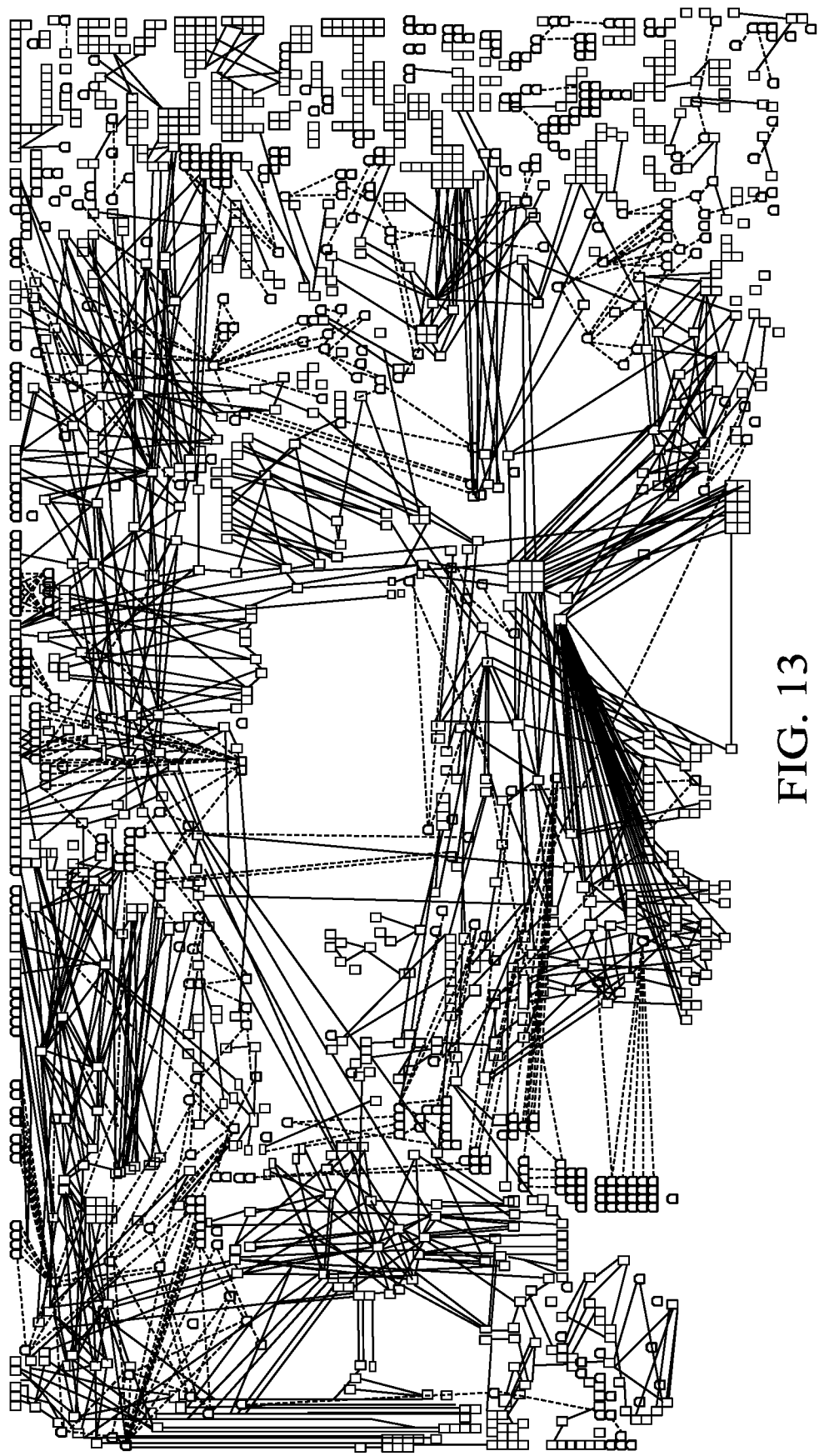
FIG. 13 illustrates example routing congestions when a variable number of latches—such as zero, one, or two latches—are interleaved between a given master-slave flop pair, according to embodiments of the present disclosure.

FIG. 13 illustrates example routing congestions when a variable number of latches—such as zero, one, or two latches—are interleaved between a given master-slave flop pair. Such routing congestion may occur for an example device under test when various circuit logic is connected to the latches and flops. The routing congestion is reduced when compared to FIG. 11 or FIG. 12.

Figure 8:
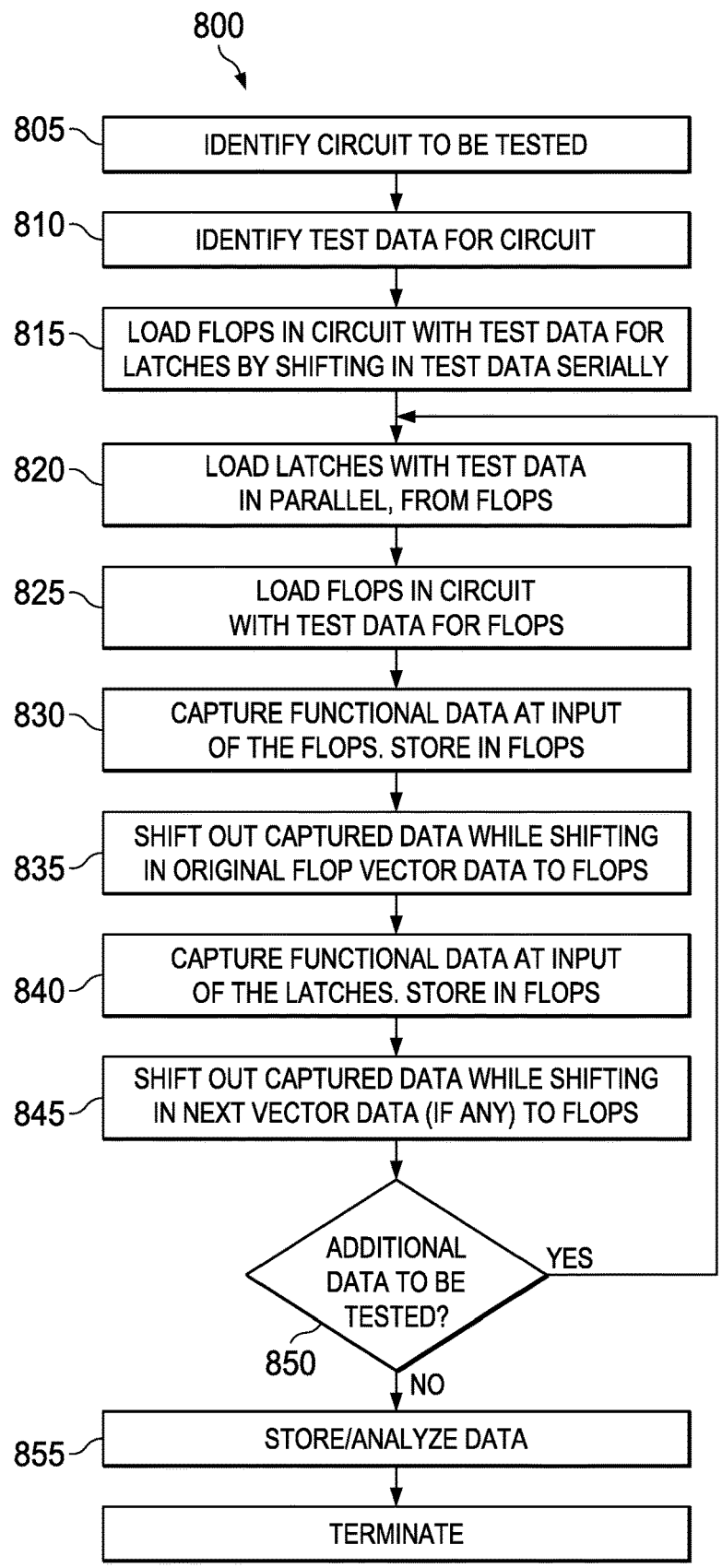
FIG. 8 illustrates an example method for testing a circuit, according to embodiments of the present disclosure.

FIG. 8 illustrates an example method 800 for testing a circuit, according to embodiments of the present disclosure.

At 805, a circuit to be tested may be identified. The circuit may require a particular set of test data to be executed across various logic blocks or portions of circuitry therein. At 810, appropriate test data and control signals to test the circuit may be retrieved or identified based upon the type of circuit.

At 815, flops in the circuit may be loaded with test vector data. The test vector data may correspond to latches that are to be tested. The test data may be loaded in the test vectors by shifting in the data serially.

At 820, latches may be loaded with test data. The test data may be transferred from the flops. The test data may be issued in parallel.

At 825, flops in the circuit may be loaded with their own test data.

After test bits have traveled from the flops and latches to various portions of the circuit under test, at 830, the resulting data may be harvested for comparison against expected values. The functional data generated may be captured at the flops. The result might itself be stored in the flops. At 835, the results may be shifted out while the original flop vector data may be shifted in to the flops. At 840, functional data may be captured at the latches and stored into the flops. At 845, such captured data may be shifted out from the flops. If additional test data is to be processed, the test data may be loaded into the flops.

At 850, if there is additional data that is to be tested, method 800 may proceed to 820. Otherwise, at 855, data retrieved during the scanning and testing process may be stored, written, or analyzed as necessary. Method 800 may terminate.

Method 800 may be implemented by any suitable mechanism, such as by system 100 and the elements of one or more of FIG. 1-7 or 9. Method 800 may optionally repeat or terminate at any suitable point. Moreover, although a certain number of steps are illustrated to implement method 800, the steps of method 800 may be optionally repeated, performed in parallel or recursively with one another, omitted, or otherwise modified as needed. Method 800 may initiate at any suitable point, such as at 805.

Although example embodiments have been described above, other variations and embodiments may be made from this disclosure without departing from the spirit and scope of these embodiments.

The invention claimed is:

1. A system for scanning a circuit, the system comprising:
a plurality of flip-flops;
a plurality of latches interleaved between the flip-flops;
a plurality of multiplexers interleaved between the flip-flops and the latches;
scan logic configured to control the multiplexers to load a plurality of initial test data into the flip-flops and the latches;
wherein:
a first pair of latches are interleaved between a first pair of consecutive flip-flops;
the multiplexers are configured to propagate a plurality of resulting test data between the flip-flops and latches, the resulting test data resulting from operation of the circuit on the initial test data;
a variable number of latches are interleaved between a plurality of pairs of flip-flops of the plurality of flip-flops, including:
a first set of latches interleaved between second pair of flip-flops; and
a second set of latches interleaved between a third pair of flip-flops;
the scan logic is further configured to:
enable a first number of latches of the first set of latches for a test; and
enable a second number of latches of the second set of latches of the test;
the first number of latches and the second number of latches are different;
the first number of latches are enabled with a first enablement signal;
the second number of latches are enabled with a second enablement signal; and
the first enablement signal and the second enablement signal are different enablement signals.

2. The system of claim 1, wherein a single latch is interleaved between a second pair of flip-flops of the plurality of flip-flops.

3. The system of claim 1, wherein no latch is interleaved between a second pair of flip-flops of the plurality of flip-flops.

4. The system of claim 1, wherein the first pair of consecutive flip-flops are a master-slave pair of flip-flops.

* * * * *